United States Patent
Dauksher

(10) Patent No.: US 6,661,666 B1
(45) Date of Patent: Dec. 9, 2003

(54) DEVICE FOR ENHANCING THE LOCAL COOLING OF ELECTRONIC PACKAGES SUBJECT TO LAMINAR AIR FLOW

(75) Inventor: Walter J. Dauksher, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/253,961

(22) Filed: Sep. 24, 2002

(51) Int. Cl.[7] .................................................. H05R 7/20
(52) U.S. Cl. ................ 361/719; 361/690; 361/704; 361/718; 361/720; 174/16.1; 174/16.3; 257/721; 257/722; 165/80.3; 165/185
(58) Field of Search ........................... 361/704, 707, 361/709, 712, 710, 717–719, 690, 695; 257/706, 712, 721; 174/16.1, 16.3; 165/80.2, 80.3, 104.33, 122

(56) References Cited

U.S. PATENT DOCUMENTS

| | | | |
|---|---|---|---|
| 4,103,737 A | * 8/1978 | Perkins | .................. 165/109.1 |
| 4,107,760 A | 8/1978 | Zimmer | |
| 4,291,364 A | 9/1981 | Andros et al. | |
| 4,375,290 A | 3/1983 | Zucchi et al. | |
| 4,541,004 A | 9/1985 | Moore | |
| 4,674,004 A | 6/1987 | Smith et al. | |
| 4,739,444 A | 4/1988 | Zushi et al. | |
| 5,077,601 A | * 12/1991 | Hatada et al. | ............... 257/722 |
| 5,208,729 A | 5/1993 | Cipolla et al. | |
| 5,388,429 A | 2/1995 | Shackelford et al. | |
| 5,406,451 A | * 4/1995 | Korinsky | ..................... 361/697 |
| 5,422,787 A | 6/1995 | Gourdine | |
| 5,514,906 A | * 5/1996 | Love et al. | .................. 257/712 |
| 5,526,231 A | 6/1996 | Arz et al. | |
| 5,813,243 A | 9/1998 | Johnson et al. | |
| 5,914,857 A | * 6/1999 | Johnson et al. | ............. 361/690 |
| 6,259,601 B1 | 7/2001 | Jaggers et al. | |
| 6,317,320 B1 | 11/2001 | Cosley et al. | |
| 6,330,154 B1 | 12/2001 | Fryers et al. | |
| 6,364,009 B1 | * 4/2002 | MacManus et al. | ......... 165/185 |
| 6,407,917 B1 | * 6/2002 | Craft et al. | .................. 361/690 |
| 6,538,888 B1 | * 3/2003 | Wei et al. | .................... 361/697 |

FOREIGN PATENT DOCUMENTS

WO    WO98/34450    8/1998

* cited by examiner

*Primary Examiner*—Boris Chervinsky

(57) ABSTRACT

A device having features for enhancing the cooling of an electronic package subject to laminar air flow. The features include a bluff body, located adjacent the electronic package and within the laminar air flow, for creating turbulence in the air flow to enhance the cooling of the package. The turbulence creates a greater cooling effect of the air flow on the electronic package, and the bluff body can include a rod or other structure mounted adjacent the electronic package. The bluff body can also be mounted on the electronic package or on a heat sink mounted on top of the package.

20 Claims, 5 Drawing Sheets

US 6,661,666 B1

DEVICE FOR ENHANCING THE LOCAL COOLING OF ELECTRONIC PACKAGES SUBJECT TO LAMINAR AIR FLOW

FIELD OF THE INVENTION

The present invention relates to devices and methods to alter air flow over electronic packages in order to enhance the cooling of them.

BACKGROUND OF THE INVENTION

Electronic circuits tend to generate heat when activated, and the heat can have adverse effects on the performance of them. In particular, the heat can make a temperature of the circuits rise to a level outside of the normal operating range of the circuits. When this condition occurs, the circuits may not operate properly or, worse yet, they may fail. Therefore, many devices that include electronic circuits also have ways in which to cool the circuits. One common technique involves the use of a fan to generate a flow of laminar air over the circuits in order to cool them via convection. In some cases, however, this flow of air itself does not provide sufficient cooling. Other types of cooling mechanisms are possible; however, those mechanisms, aside from air flow, can be expensive and difficult to implement.

Accordingly, a need exists for ways in which to enhance the cooling of electronic circuits subject to laminar air flow.

SUMMARY OF THE INVENTION

A device consistent with the present invention includes features for enhancing the cooling of an electronic package subject to laminar air flow. The features include a bluff body, located adjacent and upstream of the electronic package and within the laminar air flow, for creating turbulence in the air flow to enhance the cooling of the package. The turbulence creates a greater cooling effect of the air flow on the electronic package.

A method consistent with the present invention enhances cooling of an electronic package subject to laminar air flow. The method includes providing an electronic package subject to laminar air flow for cooling of the package and creating turbulence in the air flow to enhance the cooling of the package.

BRIEF DESCRIPTION OF THE DRAWINGS

The accompanying drawings are incorporated in and constitute a part of this specification and, together with the description, explain the advantages and principles of the invention.

DETAILED DESCRIPTION

Embodiments consistent with the present invention provide a bluff body within a laminar air flow used to cool electronic components. The bluff body creates turbulence, typically vortices, within the air flow, and the turbulence enhances the cooling effect of the laminar air flow. Therefore, in those devices having electronic components and cooled by laminar air flow, the use of the bluff body can provide, for example, an easy way to enhance the cooling effect of the laminar air flow without substantial modification of the devices.

Figure 1:
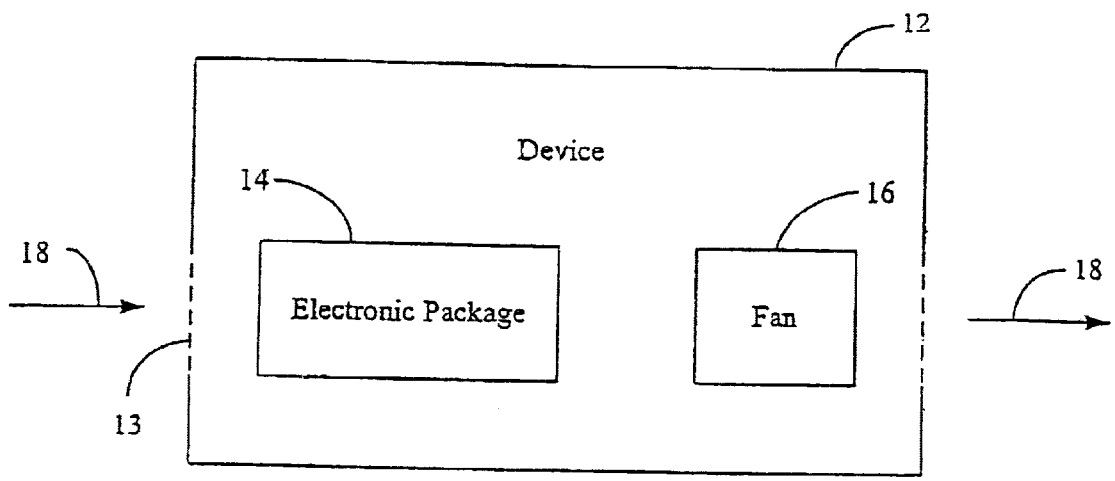
FIG. 1 is a diagram of a device including an electronic package requiring cooling via air flow.

FIG. 1 is a diagram of a device 12 including an electronic package 14 requiring cooling via air flow. In particular, device 12 includes a fan 16 to draw air from device 12 and to provide a laminar air flow across electronic package 14 for use in cooling it. In this example, fan 16 draws air into device 12 via vents 13 to provide a laminar air flow 18 across electronic package 14. The laminar air flow 18 draws heat away from electronic package 14 via convection for use in cooling it. Device 12 can include other electronic packages and components based upon a particular implementation, and FIG. 1 is intended to illustrate use of a laminar air flow to cool electronic components. Although fan 16 is shown as drawing air flow 18 across electronic package 14, it can alternatively push an air flow across the electronic package. Device 12 represents any device or product including electronic packages.

Figure 2:
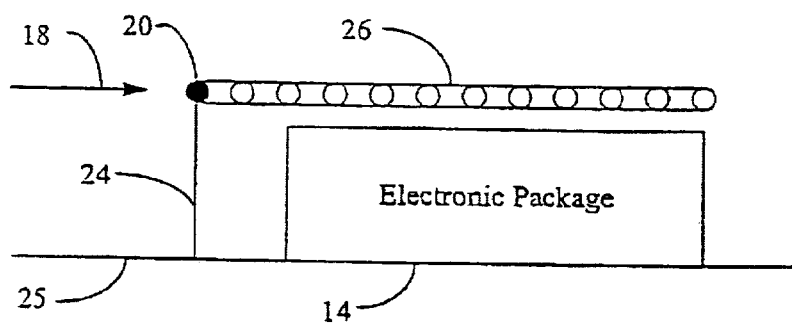
FIG. 2 is a diagram conceptually illustrating enhancing cooling of an electronic package subject to laminar air flow by using a bluff body in the air flow.
Figure 3:
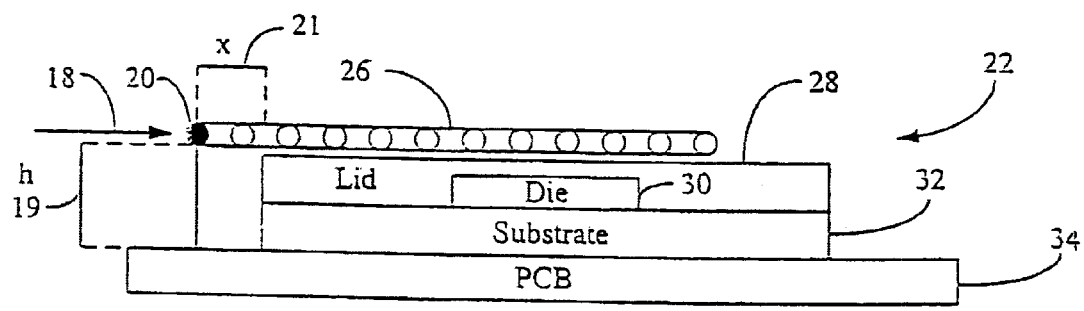
FIG. 3 is a diagram illustrating in a side view enhancing cooling of an IC package using a bluff body.
Figure 7:
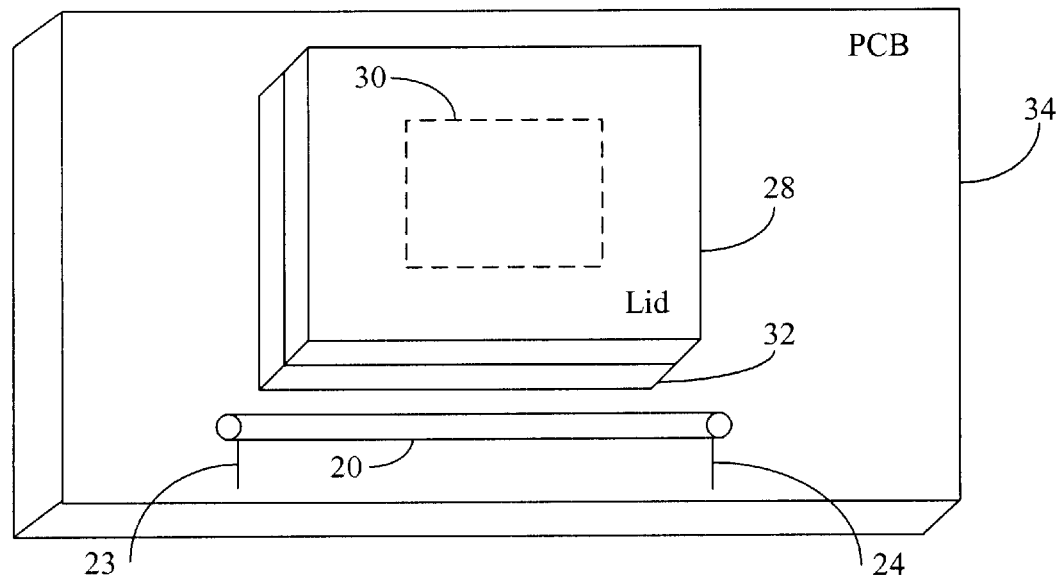
FIG. 7 is a perspective view of the diagram shown in FIG. 3.

FIG. 2 is a diagram conceptually illustrating enhancing cooling of electronic package subject to laminar air flow 18 by using a bluff body 20 in the air flow 18. In particular, bluff body 20 creates turbulence, in this example vortices 26, in the laminar air flow 18 according to the von-Karman effect. The vortices 26 occur across electronic package 14 and they enhance the cooling effect of laminar air flow 18 on electronic package 14. In this exemplary embodiment, bluff body 20 is mounted on a surface 25, such as a printed circuit board (PCB), via mounts 23,24 (see FIG. 7). Accordingly, for those devices cooled by use of a laminar air flow, use of bluff body 20 provides, for example, an inexpensive and easy way in which to modify those devices to enhance the cooling effect of the laminar air flow.

The use of bluff body 20 can be implemented, for example, in devices having integrated circuit (IC) components as electronic package 14. FIGS. 3–7 illustrate use of bluff body 20 to enhance the cooling effect an IC package 22. In particular, FIGS. 3, 5, 6, and 7 provide, respectively, side, front, top, and perspective views of IC package 22. As shown in FIGS. 3–7, IC package 22 includes a substrate 32 attached to a PCB 34. A die 30 includes circuitry and is attached to substrate 32 and covered by a lid 28. Die 30 typically includes a piece of silicon or other material to embody circuit components to perform particular functions.

Figure 4:
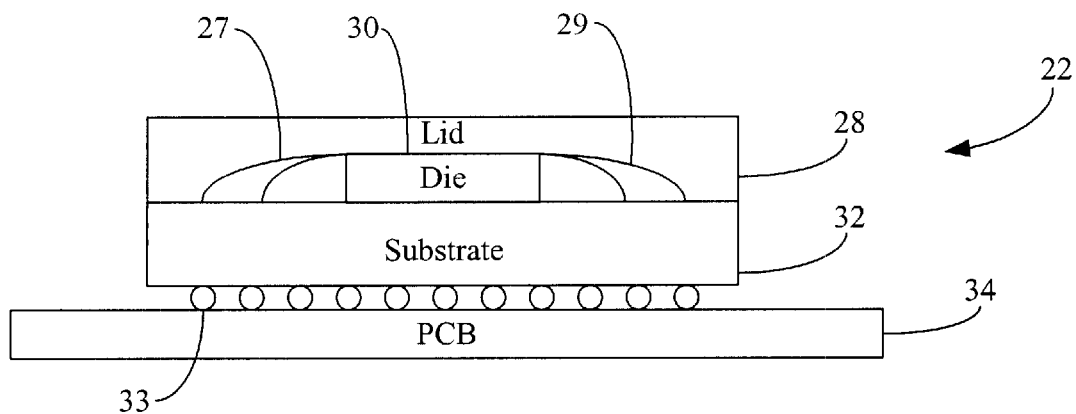
FIG. 4 is a diagram providing a more detailed illustration of an exemplary IC package.
Figure 5:
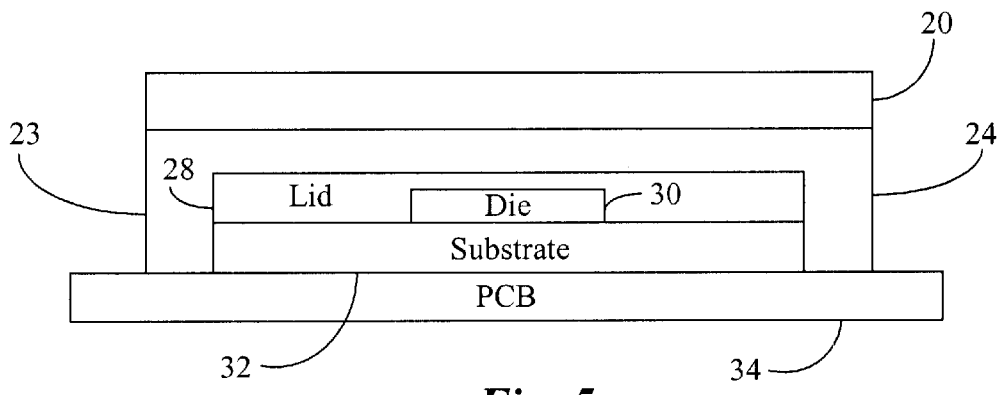
FIG. 5 is a front view of the diagram shown in FIG. 3.
Figure 6:
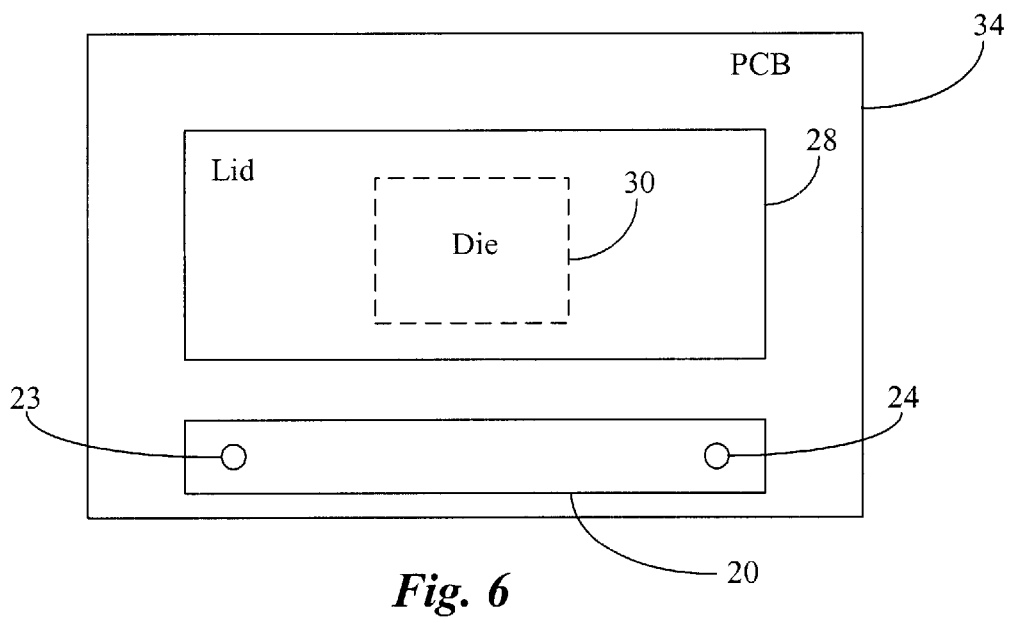
FIG. 6 is a top view of the diagram shown in FIG. 3.

FIG. 4 illustrates in more detail the components of an exemplary IC package 22. A typical IC package includes wires 27 and 29 that provide electronic connections between die 30 and substrate 32. Lid 28 can include, for example, a plastic material encasing wires 27 and 29, and covering die 30. Substrate 32 is attached to and electrically connected with PCB 34 via solder balls 33, for example. Alternatively, some IC packages are attached to PCBs via metal legs. As another alternative, some IC packages have lids and others do not. The bluff body to enhance cooling can be used with any type of electrical or IC package configured in any way. The package shown in FIG. 4 is only one such example.

As illustrated in FIGS. 3 and 5–7, bluff body 20 is mounted adjacent and upstream of IC package 22 in order to create turbulence in air flow 18 to enhance the cooling effect of air flow 18 over IC package 22. In this example, bluff body 20 is positioned adjacent lid 28; alternatively, for those packages not having a lid, bluff body 20 can be positioned adjacent and upstream of a top surface or other surface of the package. A position of bluff body 20, as well as its cross-sectional shape and size, can be varied, via empirical evidence for example, in order to optimize the enhanced cooling effect of the turbulence that it creates in air flow 18. In particular, the height 19 from PCB 34 and horizontal distance 21 from lid 28 can be adjusted. In this example, the lower surface of bluff body 20 is positioned flush with a top surface of lid 28; however, the vertical position of it can be varied, as illustrated by height 19, to provide for optimized cooling effect by turbulence 26 that it creates in air flow 18.

Figure 8:
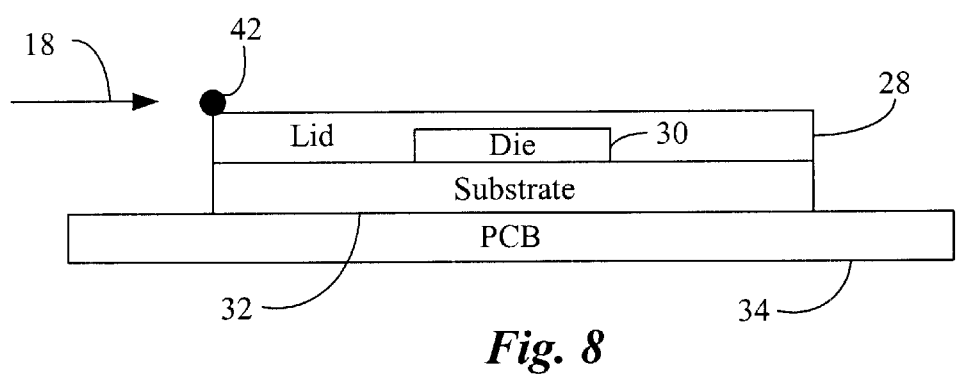
FIG. 8 is a diagram of an alternative embodiment using a bluff body attached to an IC package to enhance cooling of it.

FIG. 8 is a diagram of an alternative embodiment using a fixed bluff body 42 attached directly to an IC package to enhance cooling of it. In this embodiment, bluff body 42 is attached to lid 28, rather than being mounted at a distance from it. Therefore, simply mounting bluff body 42 to the lid of an IC package can create turbulence in air flow 18 and enhance its cooling effect.

Figure 9:
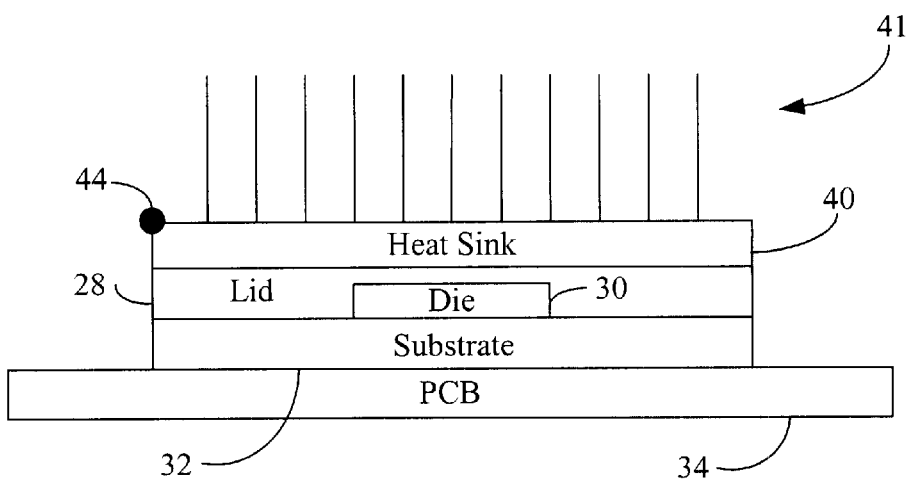
FIG. 9 is a diagram of an alternative embodiment using a bluff body attached to a heat sink on an IC package to enhance cooling of the package.

FIG. 9 is a diagram of an alternative embodiment using a fixed bluff body 44 attached to a heat sink 40 on IC package 22 to enhance cooling of the package. Some IC packages include a heat sink attached to the lid of the package in order to enhance the cooling effect of laminar air flow 18. In particular, the heat sink includes a plurality of fins 41 to draw heat away from IC package 22, and the fins 41 provide a larger surface area in to increase the effect of heat dissipating via convection created by air flow 18. Bluff body 44 creates turbulence or vortices in an air flow to further enhance the cooling effect of heat sink 40. Also, bluff body 44 creates the turbulence prior to the package or body to be cooled, even if it contains other cooling elements such as a heat sink, and bluff body 44 need not necessarily be in contact with the package in order to enhance the cooling of it. Using a separate bluff body, not necessarily in contact with the package, can facilitate an ease of incorporating the bluff body into a product, for example.

Figure 10:
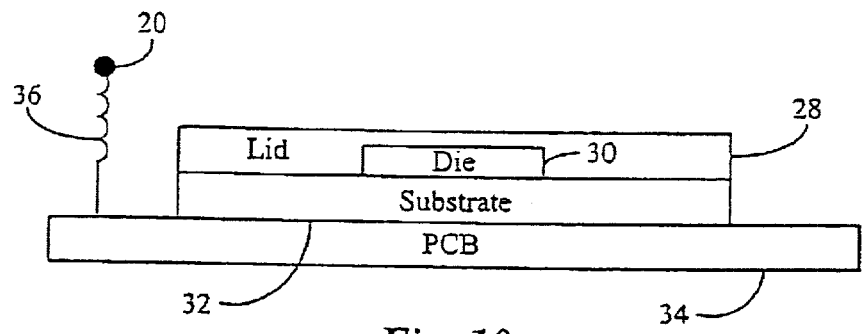
FIG. 10 is diagram of an alternative embodiment using a movable bluff body to enhance cooling of an IC package.

FIG. 10 is diagram of an alternative embodiment using a movable bluff body 20 to enhance cooling of IC package 22. In this exemplary embodiment, bluff body 20 is mounted to PCB 34 via a spring 36 so a position of bluff body 20 can fluctuate in order to create additional turbulence within air flow 18. As an alternative to a spring, any movable mount can be used to attach bluff body 20 adjacent IC package 22. As another alternative, the bluff body can be designed so that the body itself will flex, while held by rigid mounts, in order to further enhance the turbulence that it creates.

Figure 11:
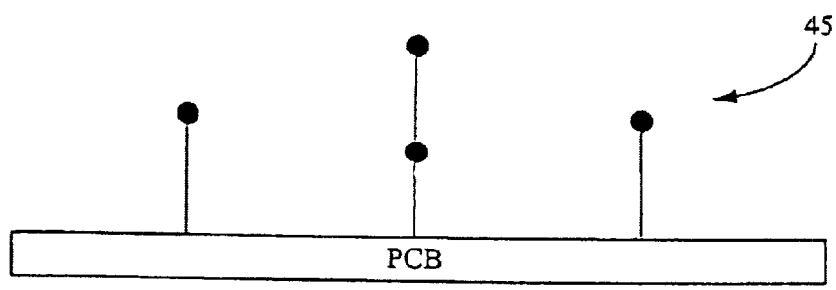
FIG. 11 is a diagram of an alternative embodiment of the bluff body including a matrix of rods.

In any embodiment, bluff body 20 can be implemented with a rod, for example, in any material providing sufficient rigidity to create the vortices. For example, it can be implemented with a plastic or metal material. Also, bluff body 20 is shown as having a round cross-sectional shape for illustrative purposes only, and it can have any cross-sectional shape depending upon particular implementations. For example, different shapes may produce varying amounts of vortices. The term "bluff body" is intended to include anything that can create vortices or turbulence by at least partially blocking an air flow. Also, bluff body 20 can be attached to the electrical or IC package using any type of mounts, and mounts 23 and 24 are provided only as an example. Alternatively, bluff body 20 can be attached to lid 28 via mounts. FIG. 11 is a diagram of an alternative embodiment of the bluff body including a matrix of rods 45. A bluff body can include any number and configuration of elements.

Figure 12:
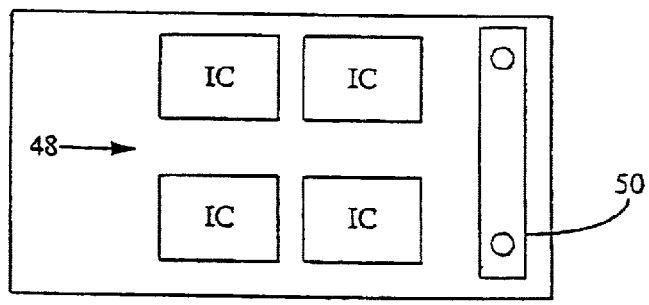
FIG. 12 is a diagram illustrating use of a common bluff body to enhance cooling of multiple IC packages on a single PCB.
Figure 13:
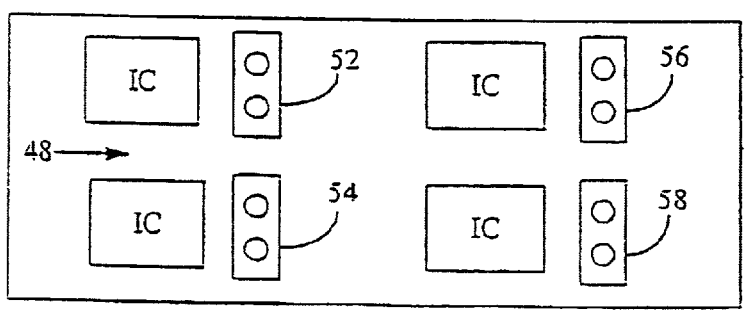
FIG. 13 is a diagram illustrating use of individual bluff bodies to enhance cooling of multiple IC packages on a single PCB.

FIG. 12 is a diagram illustrating use of a common bluff body to enhance cooling of multiple IC packages on a single PCB. In this exemplary embodiment, a bluff body 50 creates turbulence across multiple IC packages 48. In another alternative embodiment, as shown in FIG. 13, multiple bluff bodies 52, 54, 56, and 58 are positioned adjacent multiple IC packages 48 in order to enhance the cooling of them, as described above.

Figure 14:
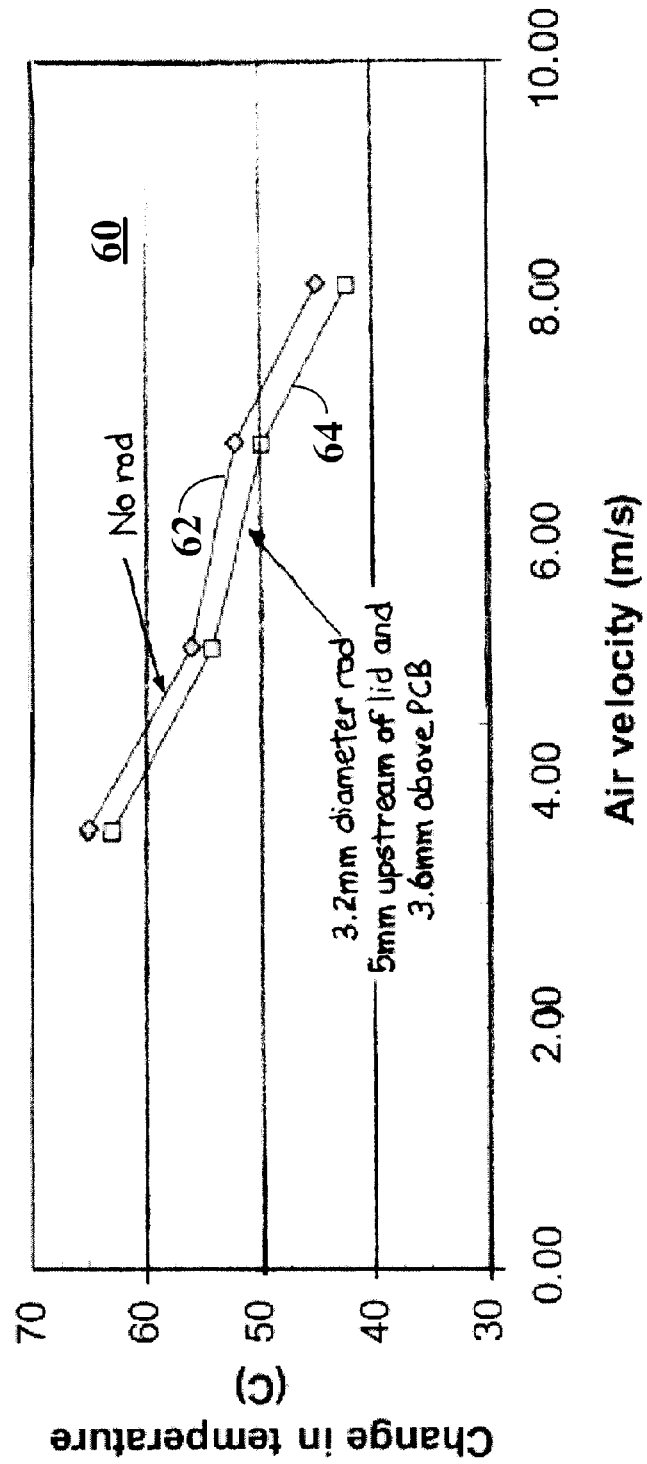
FIG. 14 is a graph of test data illustrating the enhancement in cooling of an IC package using a bluff body.

FIG. 14 is a graph of test data 60 illustrating the enhancement in cooling of an IC package using a bluff body. The data illustrates temperature on the vertical axis versus air velocity on the horizontal axis. A first graph 62 represents a temperature of a test electrical package without a bluff body, and a second graph 64 represents a temperature of the test electrical package with a bluff body present, in this example a rod, in order to enhance the cooling effect of a laminar air flow across the electrical package. As illustrated, the temperature with a bluff body present (graph 64) is lower than the temperature without the bluff body (graph 62).

While the present invention has been described in connection with an exemplary embodiment, it will be understood that many modifications will be readily apparent to those skilled in the art, and this application is intended to cover any adaptations or variations thereof. For example, various types and configurations of bluff bodies may be used without departing from the scope of the invention. This invention should be limited only by the claims and equivalents thereof.

What is claimed is:

1. A device for enhancing cooling of an electronic package subject to laminar air flow, comprising:
   an electronic package subject to laminar air flow over the package for cooling of the package; and
   a bluff body, located adjacent and upstream of the electronic package and within the laminar air flow, for creating turbulence in the air flow to enhance the cooling of the package, wherein the bluff body is mounted adjacent the electronic package via a movable mount allowing the bluff body to fluctuate in the air flow.

2. The device of claim 1 wherein the electronic package includes an integrated circuit mounted on a printed circuit board.

3. The device of claim 1 wherein the bluff body includes a fixed rod.

4. The device of claim 1 wherein the bluff body includes a movable rod.

5. The device of claim 4 wherein the movable rod is mounted adjacent the electronic package via a spring.

6. The device of claim 1 wherein the bluff body is mounted on the electronic package.

7. The device of claim 1 wherein the bluff body has a round cross-sectional shape.

8. The device of claim 1, further including a heat sink mounted on the electronic package.

9. The device of claim 8 wherein the bluff body is mounted on the heat sink.

10. The device of claim 1, further including a plurality of electronic packages, and wherein the bluff body is mounted adjacent all of the plurality of electronic packages for enhancing the cooling of the electronic packages.

11. The device of claim 1 wherein the bluff body creates vortices in the air flow as the turbulence.

12. A method for enhancing cooling of an electronic package subject to laminar air flow, comprising:

providing an electronic package subject to laminar air flow over the package for cooling of the package;

creating turbulence in the air flow, using a bluff body in the air flow, to enhance the cooling of the package; and allowing the bluff body to fluctuate in the air flow via a movable mount.

13. The method of claim 12 wherein the creating step includes using a fixed rod adjacent and upstream of the electronic package in the air flow to create the turbulence.

14. The method of claim 12 wherein the creating step includes using a movable rod in the air flow to create the turbulence.

15. The method of claim 14, further including allowing movement of the movable rod via a spring.

16. The method of claim 12, further including mounting the bluff body on the electronic package.

17. The method of claim 12, further including mounting a heat sink on the electronic package.

18. The method of claim 17, further including mounting a bluff body on the heat sink to create the turbulence.

19. The method of claim 12, further including:

providing a plurality of electronic packages; and mounting bluff bodies adjacent all of the plurality of electronic packages for enhancing the cooling of the electronic packages.

20. The method of claim 12 wherein the creating step includes creating vortices in the air flow as the turbulence.

* * * * *